(12) United States Patent
Shi et al.

(10) Patent No.: US 9,456,514 B2
(45) Date of Patent: Sep. 27, 2016

(54) PHASE SHIFTING DEVICE

(71) Applicant: Tongyu Communication Inc., Zhongshan, Guangdong (CN)

(72) Inventors: Lei Shi, Zhongshan (CN); Zhonglin Wu, Zhongshan (CN); Peng Wan, Zhongshan (CN); Tieyong Fang, Zhongshan (CN); Bo Yan, Zhongshan (CN); Gang Cheng, Zhongshan (CN)

(73) Assignee: Tongyu Communication, Inc., Zhongshan, Guangdong (CN)

( * ) Notice: Subject to any disclaimer, the term of this patent is extended or adjusted under 35 U.S.C. 154(b) by 183 days.

(21) Appl. No.: 13/766,328

(22) Filed: Feb. 13, 2013

(65) Prior Publication Data

US 2013/0155588 A1     Jun. 20, 2013

Related U.S. Application Data

(63) Continuation-in-part of application No. PCT/CN2012/071181, filed on Feb. 16, 2012.

(30) Foreign Application Priority Data

Aug. 22, 2011    (CN) .......................... 2011 1 0241944

(51) Int. Cl.
  *H01P 9/00*     (2006.01)
  *H05K 7/00*     (2006.01)
  *H01P 5/12*     (2006.01)
  *H01P 1/18*     (2006.01)
(52) U.S. Cl.
  CPC ................. *H05K 7/00* (2013.01); *H01P 1/184* (2013.01); *H01P 5/12* (2013.01)

(58) Field of Classification Search
  USPC ........................................ 333/117, 156–164
  See application file for complete search history.

(56) References Cited

U.S. PATENT DOCUMENTS

| 6,005,515 | A  | * | 12/1999 | Allen et al. ................... 342/374 |
| 6,043,722 | A  | * | 3/2000  | Vaninetti et al. ............. 333/128 |
| 7,855,696 | B2 | * | 12/2010 | Gummalla et al. ........... 343/876 |
| 8,462,047 | B1 | * | 6/2013  | Ai et al. ........................ 342/372 |
| 2004/0119551 | A1 | * | 6/2004 | Wray .......................... 333/22 R |
| 2008/0145634 | A1 | * | 6/2008 | Hillermeier et al. ......... 428/221 |
| 2009/0224848 | A1 | * | 9/2009 | Lindmark ..................... 333/159 |
| 2010/0194278 | A1 | * | 8/2010 | Ouyang .................... 315/111.21 |

(Continued)

FOREIGN PATENT DOCUMENTS

| CN | 1805214   A | 7/2006 |
| CN | 101414701 A | 4/2009 |
| CN | 101707271 A | 5/2010 |

(Continued)

OTHER PUBLICATIONS

International Search Report for International Application No. PCT/CN2012/071181, from the State Intellectual Property Office of China, dated May 17, 2012.

(Continued)

*Primary Examiner* — Brandon S Cole
(74) *Attorney, Agent, or Firm* — Finnegan, Henderson, Farabow, Garrett & Dunner LLP

(57) ABSTRACT

A phase shifting device, including: a housing; and at least one multipath phase shifter assembly in the housing, wherein the multipath phase shifter assembly includes at least two phase shifters disposed in parallel in a planar arrangement.

12 Claims, 15 Drawing Sheets

(56) References Cited

U.S. PATENT DOCUMENTS

2010/0214170 A1* 8/2010 Quan .......................... 342/374
2012/0028690 A1* 2/2012 Liu .............................. 455/571

FOREIGN PATENT DOCUMENTS

| CN | 102082327 | A | 6/2011 |
|---|---|---|---|
| CN | 102157767 | A | 8/2011 |
| CN | 201937008 | U | 8/2011 |
| CN | 102354775 | A | 2/2012 |

OTHER PUBLICATIONS

Written Opinion of the International Search Authority for International Application No. PCT/CN2012/071181, from the State Intellectual Property Office of China, dated May 17, 2012.

* cited by examiner

PHASE SHIFTING DEVICE

RELATED APPLICATIONS

This application is a continuation-in-part of International Application No. PCT/CN2012/071181, filed Feb. 16, 2012, which claims the benefit of priority from Chinese Patent Application No. 201110241944.4, filed Aug. 22, 2011, the entire contents of all of which are incorporated herein by reference.

FIELD

This application relates to a mobile communication system and, more particularly, to a phase shifting device.

BACKGROUND

With the rapid development of mobile communication, a base station antenna system with high electrical and mechanical performance may be required. High performance and small dimension are generally the trends of development of base station antenna systems, including, e.g., a relatively large electrical tilt, a high operating efficiency, a wide frequency band, and a compact structure. A phase shifter is used in a feeding network of the base station antenna system. For example, the phase shifter can improve antenna directivity of a base station, such that the base station transmits signals toward one or more designated directions with a relatively strong power strength.

The base station antenna system may include multiple phase shifters, and a number of the phase shifters may be increased based on an operation need. Traditionally, increasing a number of the phase shifters significantly increases a volume of the base station antenna system and, hence, increases layout difficulty of the feeding network.

SUMMARY

According to a first aspect of the present disclosure, there is provided a phase shifting device, comprising: a housing; and at least one multipath phase shifter assembly in the housing, wherein the multipath phase shifter assembly includes at least two phase shifters disposed in parallel in a planar arrangement.

According to a second aspect of the present disclosure, there is provided a phase shifting device, comprising: a housing; and first and second multipath phase shifter assembles in the housing in a stacked arrangement, wherein each of the first and second multipath phase shifter assemblies includes at least two phase shifters disposed in parallel in a planar arrangement.

It is to be understood that both the foregoing general description and the following detailed description are exemplary and explanatory only and are not restrictive of the invention, as claimed.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of systems and methods consistent with aspects related to the invention as recited in the appended claims.

Figure 1A:
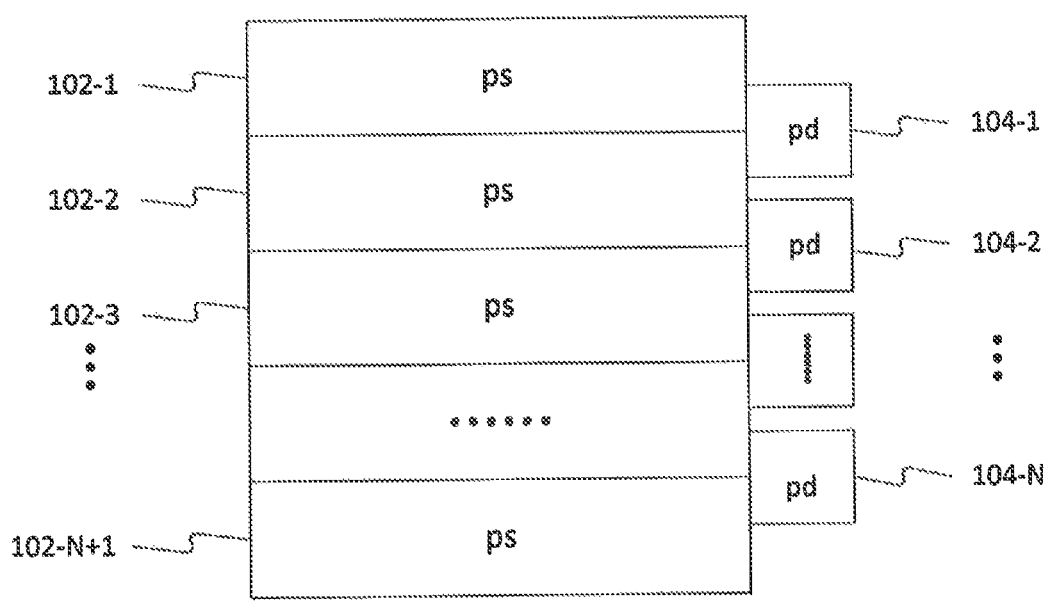
FIG. 1A illustrates a block diagram of a phase shifting device, according to an exemplary embodiment.

FIG. 1A illustrates a block diagram of a phase shifting device 100, according to an exemplary embodiment. Referring to FIG. 1A, the phase shifting device 100 includes a multipath phase shifter (ps) assembly that further includes (N+1) phase shifters 102-1, 102-2, ..., 102-N+1, wherein N is an integer. Every two adjacent phase shifters 102-*i* and 102-*i*+1 are connected by a power divider (pd). Thus, in the illustrated embodiment, there are N power dividers 104-1, 104-2, ..., 104-N accordingly in the phase shifting device 100.

Figure 1B:
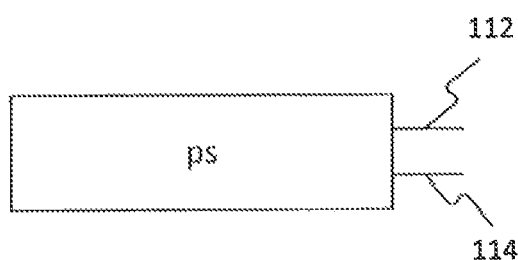
FIG. 1B illustrates a block diagram of a phase shifter, according to an exemplary embodiment.

FIG. 1B illustrates a block diagram of a phase shifter 110, according to an exemplary embodiment. For example, the phase shifter 110 may be any of the phase shifters 102-1, 102-2, ... 102-N+1 (FIG. 1A). Referring to FIG. 1B, the phase shifter 110 includes an input terminal 112 and an output terminal 114. The phase shifter 110 is configured to apply a phase shift on a signal inputted via the input terminal 112 and output the phase shifted signal via the output terminal 114.

Figure 1C:
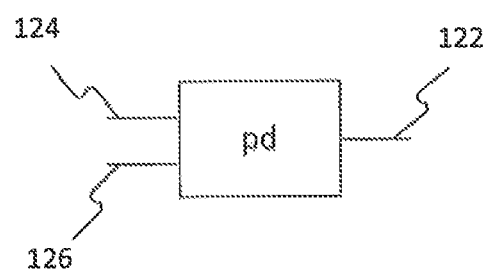
FIG. 1C illustrates a block diagram of a power divider, according to an exemplary embodiment.

FIG. 1C illustrates a block diagram of a power divider 120, according to an exemplary embodiment. For example, the power divider 120 may be any of the power dividers 104-1, 104-2, ..., 104-N (FIG. 1A). Referring to FIG. 1C, the power divider 120 includes an input terminal 122, a first output terminal 124, and a second output terminal 126. The power divider 120 is configured to split a signal inputted via the input terminal 122 into first and second output signals. The first and second output signals are outputted from the first output terminal 124 and the second output terminal 126, respectively, and may be substantially identical in waveform.

Referring back to FIG. 1A, in exemplary embodiments, an output terminal (not shown) of the phase shifter 102-*i*

Figure 2:
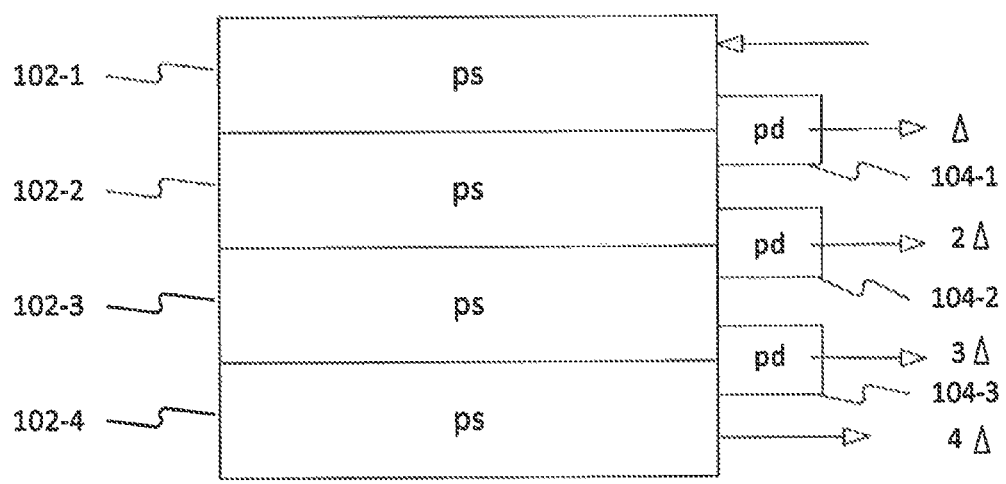
FIG. 2 illustrates a block diagram of a phase shifting device, according to an exemplary embodiment.

(i=1, 2, . . . , or N) is connected to an input terminal (not shown) of the power divider 104-*i* (i=1, 2, . . . , or N), A first output terminal (not shown) of the power divider 104-*i* is connected to an input terminal (not shown) of the phase shifter 102-*i*+1, and a second output terminal (not shown) of the power divider 104-*i* is used as an output terminal of the phase shifting device 100. Accordingly, the phase shifters 102-1, 102-2, . . . , 102-N+1 are connected in series through the power dividers 104-1, 104-2, . . . , 104-N. In addition, an input terminal (not shown) of the phase shifter 102-1 is used as an input terminal of the phase shifting device 100, and an output terminal (not shown) of the phase shifter 102-N+1 is used as an output terminal of the phase shifting device 100, in the illustrated embodiment, the phase shifters 102-1, 102-2, . . . , 102-N+1 are essentially the same and are each configured to apply a same phase shift Δ. As a result, in the illustrated embodiment, the phase shifting device 100 includes one input terminal to receive an input signal and N output terminals each to output an output signal with an additional phase shift Δ applied. For example, assuming N=3, phase shift values for the output signals of the phase shifting device 100 are Δ, 2Δ, 3Δ, and 4Δ, respectively, as shown in FIG. 2.

Figure 3:
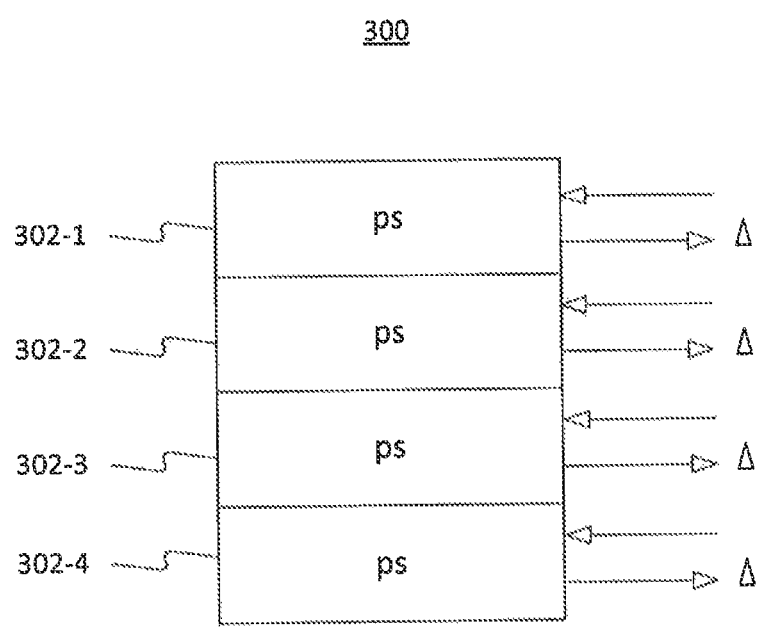
FIG. 3 illustrates a block diagram of a phase shifting device, according to an exemplary embodiment.

FIG. 3 illustrates a block diagram of a phase shifting device 300, according to an exemplary embodiment. Referring to FIG. 3, the phase shifting device 300 includes a multipath phase shifter (ps) assembly that further includes multiple phase shifters, e.g., four phase shifters 302-1, 302-2, 302-3, and 302-4, without being connected through any power dividers. The phase shifters 302-1, 302-2, 302-3, and 302-4 operate independently and may each be configured to receive an input signal and output an output signal with a phase shift applied. In the illustrated embodiment, the phase shifters 302-1, 302-2, 302-3, and 302-4 are essentially the same and are each configured to apply a same phase shift Δ. As a result, in the illustrated embodiment, the phase shifting device 300 includes four input terminals each to receive an input signal and four output terminals each to output an output signal with the phase shift Δ applied.

Figure 4:
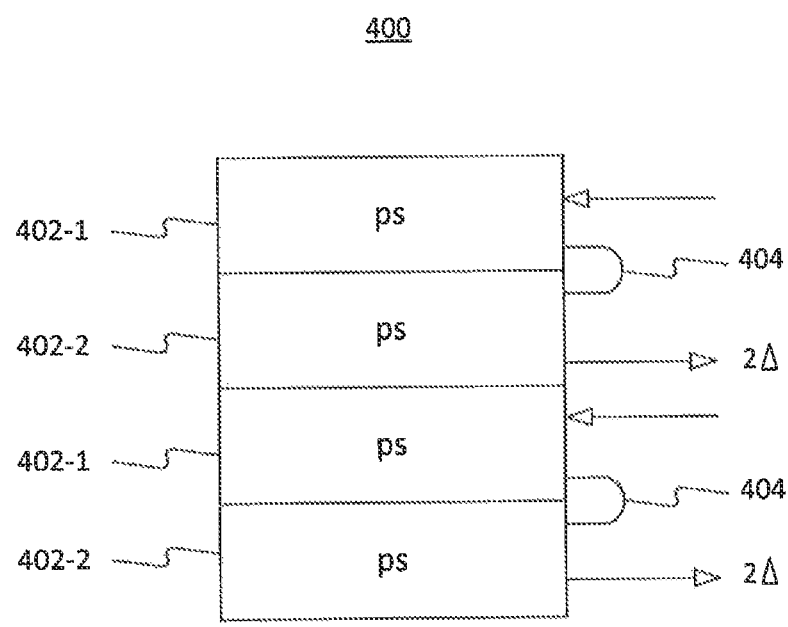
FIG. 4 illustrates a block diagram of a phase shifting device, according to an exemplary embodiment.

FIG. 4 illustrates a block, diagram of a phase shifting device 400, according to an exemplary embodiment. Referring to FIG. 4, the phase shifting device 400 includes first and second multipath phase shifter (ps) assemblies that each further include multiple shifters, e.g., two phase shifters 402-1 and 402-2, connected in series through a cable 404. The first and second multipath phase shifter assemblies operate independently and may each be configured to receive an input signal and output an output signal with a phase shift applied. In the illustrated embodiment, the phase shifters 402-1 and 402-2 are essentially the same and are each configured to apply a same phase shift Δ. As a result, in the illustrated embodiment, the phase shifting device 400 includes two input terminals each to receive an input signal and two output terminals each to output an output signal with a phase shift 2Δ applied.

Figure 5:
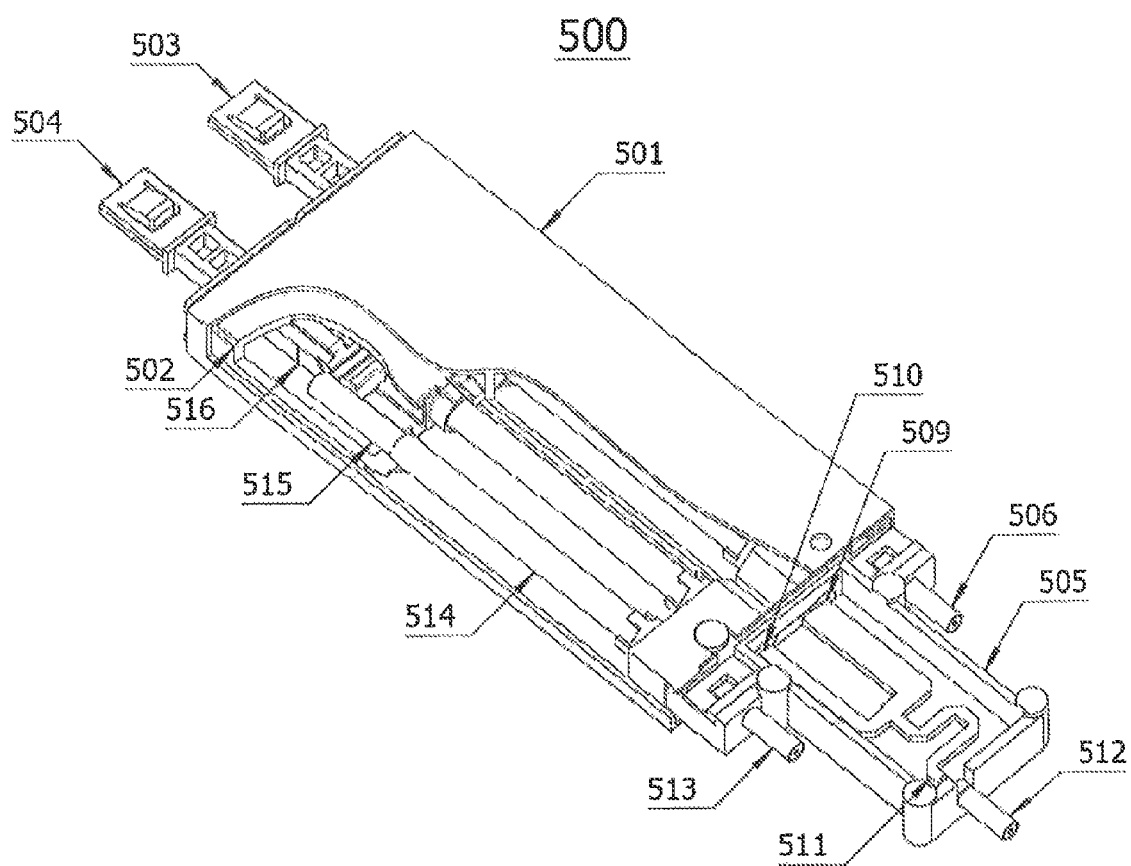
FIG. 5 shows a perspective view of a phase shifting device, according to an exemplary embodiment.

FIG. 5 shows a perspective view of a phase shifting device 500, according to an exemplary embodiment. Referring to FIG. 5, the phase shifting device 500 includes a housing that further includes a metal housing 501 and a plastic housing 502 encased therein, and a multipath phase shifter assembly that further includes first and second phase shifters 503 and 504, respectively, disposed in parallel in a planar arrangement in the plastic housing 502. It is noted that a phase shifter being in a housing, such as the phase shifter 503 being in the plastic housing 502, does not necessarily require the whole phase shifter be completely inside the housing. In addition, for illustrative purposes only, the metal housing 501 and the plastic housing 502 are not completely shown in FIG. 5. The phase shifting device 500 further includes a power divider 505 connected between the phase shifters 503 and 504. In the illustrated embodiment, the power divider 505 is implemented using a stripline.

In exemplary embodiments, the phase shifting device 500 includes an input terminal 506 and first and second output terminals 512 and 513, respectively. The input terminal 506 is configured as a coaxial cable to input signals into the phase shifter 503 via an input terminal (not shown) of the phase shifter 503, and an output terminal (not shown) of the phase shifter 503 is connected, e.g., soldered, to an input terminal 509 of the power divider 505. Further, a first output terminal 510 of the power divider 505 is connected, e.g., soldered, to an input terminal (not shown) of the phase shifter 504, and a second output terminal 511 of the power divider 505 is connected with a coaxial cable to form the output terminal 512 of the phase shifting device 500. In addition, an output terminal (not shown) of the phase shifter 504 is connected with a coaxial cable to form the second output terminal 513 of the phase shifting device 500. Thus, the phase shifter 503 and the phase shifter 504 are connected in series in the phase shifting device 500. In one exemplary embodiment, to reduce a length and obtain a compact structure for the phase shifting device 500, the input terminal 509 of the power divider 505 and the output terminal of the phase shifter 503 are integrated by a casting process, and the first output terminal 510 of the power divider 505 and the input terminal of the phase shifter 504 are also integrated by the casting process.

In exemplary embodiments, the phase shifter 504 further includes a copper tube 514, a coupling bar 515, and a drag link 516. The coupling bar 515 is inserted in the copper tube 514 to transmit signals by coupling, and the drag link 516 is connected with coupling bar 515, such that phase shift may be achieved by dragging the coupling bar 515 to change a length of a signal transmission path through the phase shifter 504. In addition, the phase shifter 503 has essentially the same structure as the phase shifter 504.

Figure 6:
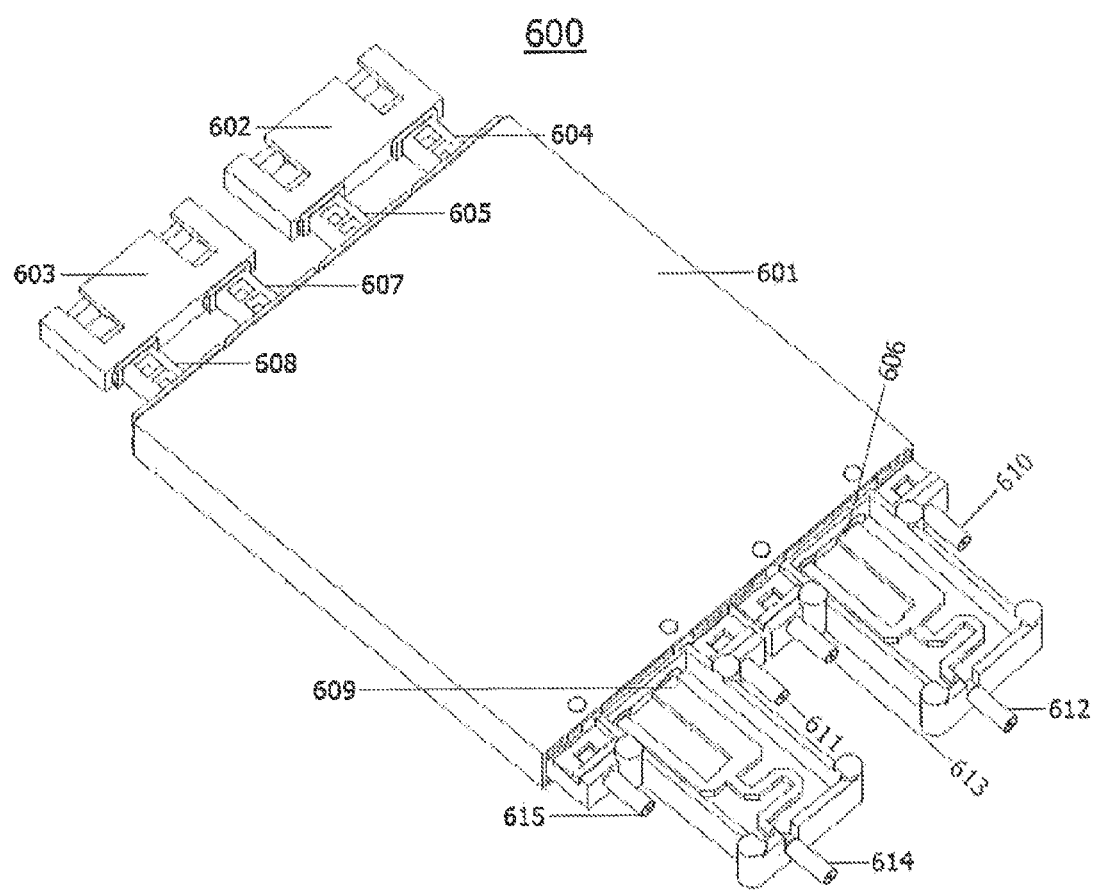
FIG. 6 shows an external view of a phase shifting device, according to an exemplary embodiment.

FIG. 6 shows an external view of a phase shifting device 600, according to an exemplary embodiment. Referring to FIG. 6, the phase shifting device 600 includes a housing 601, and first and second multipath phase shifter assemblies 602 and 603, respectively, in the housing 601. The multipath phase shifter assemblies 602 and 603 are disposed in a planar arrangement. For example, the multipath phase shifter assembly 602 includes phase shifters 604 and 605, respectively, disposed in parallel in a planar arrangement, and a first power divider 606 connected between the phase shifters 604 and 605. The multipath phase shifter assembly 603 includes third and fourth phase shifters 607 and 608, respectively, disposed in parallel in a planar arrangement, and a second power divider 609 connected between the phase shifters 607 and 608. Each of the phase shifters 604, 605, 606, and 607 may have essentially the same structure as the phase shifter 504 (FIG. 5). In the illustrated embodiment, the first power divider 606 and the second power divider 609 are each implemented using a stripline.

In exemplary embodiments, the phase shifting device 600 includes first and second input terminals 610 and 611, respectively, and first, second, third, and fourth output terminals 612, 613, 614, and 615, respectively. The first input terminal 610 is configured as a coaxial cable to input signals to the phase shifter 604, and an output terminal (not shown) of the phase shifter 604 is connected, e.g., soldered, to an input terminal (not shown) of the power divider 606. Further, a first output terminal (not shown) of the power divider 606 is connected, e.g., soldered, to an input terminal (not shown) of the phase shifter 605, and a second output terminal (not shown) of the divider 606 is connected with a coaxial cable to form the first output terminal 612 of the phase shifting device 600. In addition, an output terminal (not shown) of the phase shifter 605 is connected with a coaxial cable to form the second output terminal 613 of the phase shifting device 600.

In exemplary embodiments, the second input terminal 611 of the phase shifting device 600 is configured as a coaxial cable to input signals to the phase shifter 607, and an output terminal (not shown) of the phase shifter 607 is connected, e.g., soldered, to an input terminal (not shown) of the power divider 609. Further, a first output terminal (not shown) of the power divider 609 is connected, e.g., soldered, to an input terminal (not shown) of phase shifter 608, and a second output terminal of the power divider 609 is connected with a coaxial cable to form the third output terminal 614 of the phase shifting device 600. In addition, an output terminal (not shown) of the phase shifter 603 is connected with a coaxial cable to form the fourth output terminal 615 of the phase shifting device 600. Thus, in the illustrated embodiment, the phase shifters 604 and 605 are connected in series to apply a first phase shift on a first signal inputted via the first input terminal 610 of the phase shifting device 600, and the phase shifters 607 and 608 are connected in series to apply a second phase shift on a second signal inputted via the second input terminal 611 of the phase shifting device 600. Therefore, each of the multipath phase shifter assemblies 602 and 603 may independently operate to phase shift in a different frequency range as a one-input and two-output device.

Figure 7:
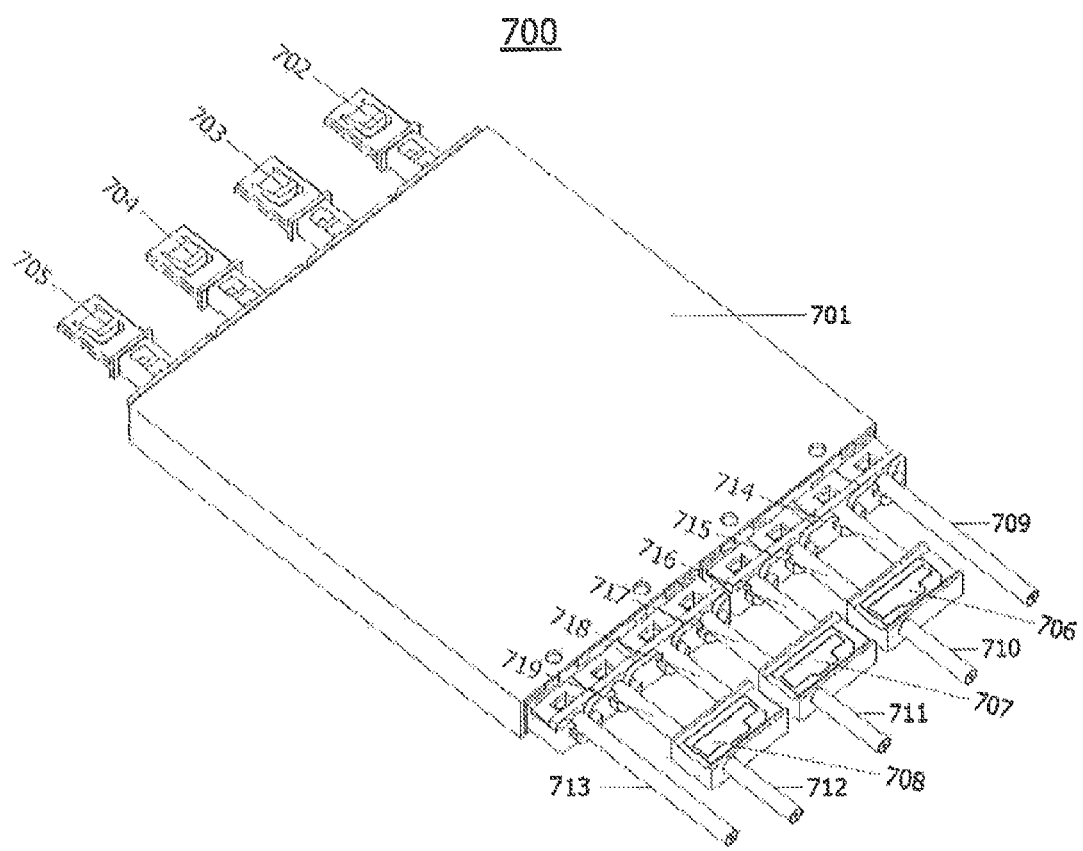
FIG. 7 shows an external view of a phase shifting device, according to an exemplary embodiment.

FIG. 7 shows an external view of a phase shifting device 700, according to an exemplary embodiment. Referring to FIG. 7, the phase shifting device 700 includes a housing 701, and a multipath phase shifter assembly that further includes first, second, third, and fourth phase shifters 702, 703, 704, and 705, respectively, disposed in parallel in a planar arrangement, and first, second, and third power dividers 706, 707, and 708, respectively. Each of the phase shifters 702, 703, 704, and 705 has essentially the same structure as the phase shifter 504 (FIG. 5). In the illustrated embodiment, the power dividers 706, 707, and 708 are each implemented using a coaxial cable with a length equal to a quarter of a wavelength corresponding to a central operating frequency.

In exemplary embodiments, the phase shifting device 700 includes an input terminal 709, and first, second, third, and fourth output terminals 710, 711, 712, and 713, respectively. The input terminal 709 is configured as a coaxial cable to input signals to the phase shifter 702, and an output terminal (not shown) of the phase shifter 702 is connected to an input terminal 714 of the power divider 706. Further, a first output terminal 715 of the power divider 706 is connected to an input terminal (not shown) of the phase shifter 703, and a second output terminal of the power divider 706 is connected with a coaxial cable to form the first output terminal 710 of the phase shifting device 700. Additionally, an output terminal (not shown) of the phase shifter 703 is connected to an input terminal 716 of the power divider 707. A first output terminal 717 of the power divider 707 is connected to an input terminal (not shown) of the phase shifter 704, and a second output terminal of the power divider 707 is connected with a coaxial cable to form the second output terminal 711 of the phase shifting device 700. Additionally, an output terminal (not shown) of the phase shifter 704 is connected to an input terminal 718 of the power divider 708. A first output terminal 719 of the power divider 708 is connected to an input terminal (not shown) of the phase shifter 705, and a second output terminal of the power divider 708 is connected with a coaxial cable to form the third output terminal 712 of the phase shifting device 700. In addition, an output terminal of the phase shifter 705 is connected with a coaxial cable to form the fourth output terminal 713 of the phase shifting device 700. Thus, the phase shifters 702, 703, 704, and 705 are connected in series in the phase shifting device 700. In the illustrated embodiment, each of the phase shifters 702, 703, 704, and 705 is configured to apply a phase shift value of $\Delta$. As a result, the output terminals 710, 711, 712, and 713 of the phase shifting device 700 provide phase shift values of $\Delta$, $2\Delta$, $3\Delta$, and $4\Delta$, respectively, similar to the signal input and outputs shown in FIG. 2.

Figure 8A:
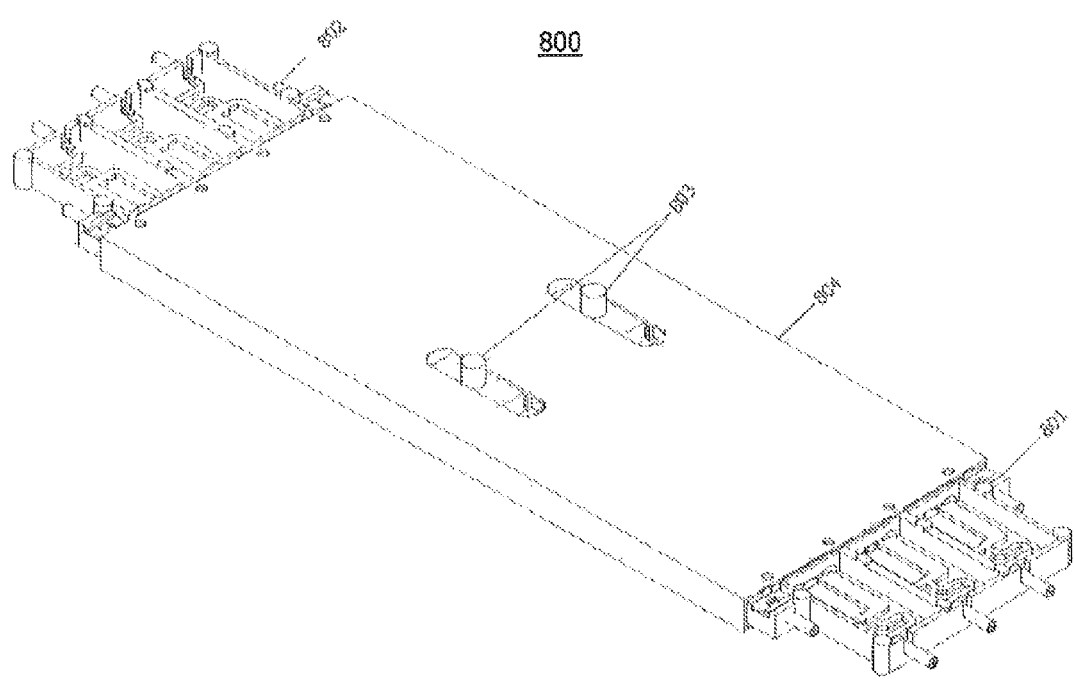
FIGS. 8A and 8B show an external view and an internal view, respectively, of a phase shifting device, according to an exemplary embodiment.
Figure 8B:
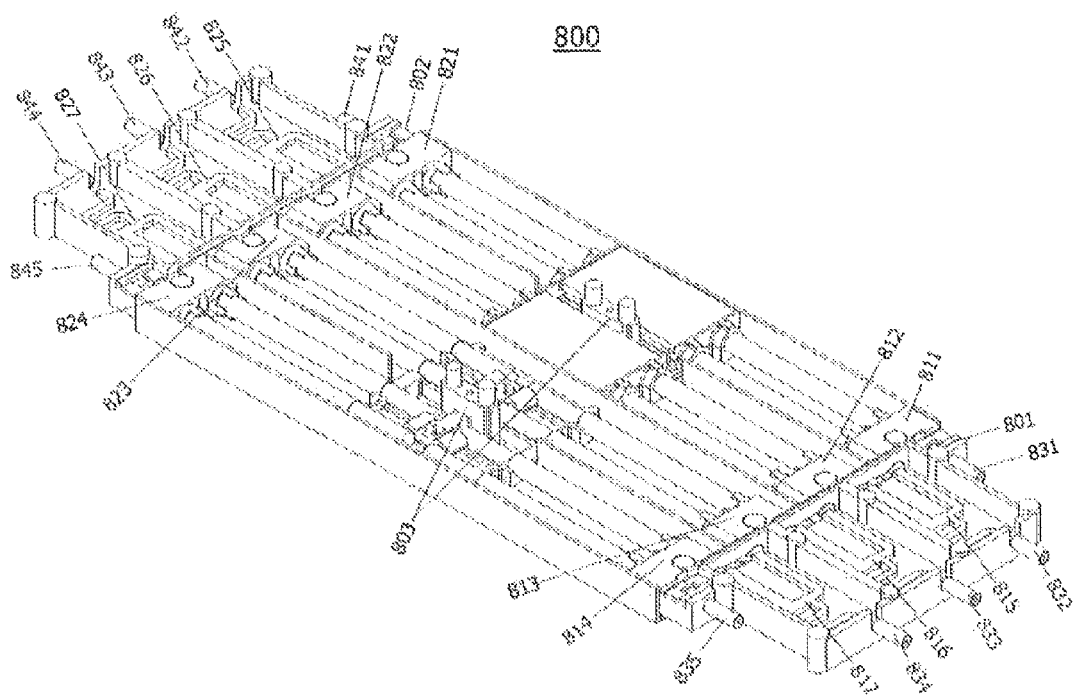

FIGS. 8A and 8B show an external view and an internal view, respectively, of a phase shifting device 800, according to an exemplary embodiment. Referring to FIGS. 8A and 8B, the phase shifting device 800 includes first and second multipath phase shifter assemblies 801 and 802 disposed in a planar arrangement and connected by a connecting member 803, and a housing 804 encasing the phase shifter assemblies 801 and 802. The phase shifter assembly 801 includes first, second, third, and fourth phase shifters 811, 812, 813, and 814, respectively, disposed in parallel, and first, second, and third power dividers 815, 816, and 817, respectively. The phase shifter assembly 802 includes first, second, third, and fourth phase shifters 821, 822, 823, and 824, respectively, disposed in parallel, and first, second, and third power dividers 825, 826, and 827, respectively.

In exemplary embodiments, the phase shifting device 800 includes a first input terminal 831, and first, second, third, and fourth output terminals 832, 833, 834, and 835, respectively, provided by the phase shifter assembly 801. The phase shifting device 800 also includes a second input terminal 841, and fifth, sixth, seventh, and eighth output terminals 842, 843, 844, and 845, respectively, provided by the phase shifter assembly 802.

In exemplary embodiments, similar to the above description in connection with FIG. 7, the phase shifters 811, 812, 813, and 814 are connected in series via the power dividers 815, 816, and 817 in the phase shifting device 800. In the illustrated embodiment, each of the phase shifters 811, 812, 813, and 814 is configured to apply a phase shift $\Delta$. Therefore the output terminals 832, 833, 834, and 835 of the phase shifting device 800 provide phase shift values of $\Delta$, $2\Delta$, $3\Delta$, and $4\Delta$, respectively, with respect to the first input terminal 831.

In addition, the phase shifters 821, 822, 823, and 824 are connected in series via the power dividers 825, 826, and 827 in the phase shifting device 800. In the illustrated embodiment, each of the phase shifters 821, 822, 823, and 824 is configured to apply a phase shift $\Delta$. Therefore the output terminals 842, 843, 844, and 845 of the phase shifting device 800 provide phase shift values of $\Delta$, $2\Delta$, $3\Delta$, and $4\Delta$, respectively, with respect to the second input terminal 841.

In exemplary embodiments, the connecting member 803 is configured to adjust the phase shift value provided by each of the output terminals 832, 833, 834, 835, 842, 843, 844, and 845 of the phase shifting device 800, by adjusting signal transmission path lengths in the phase shifters 811, 812, 813, 814, 821, 822, 823, and 824, respectively. For example, the output terminals 832, 833, 834, and 835 of the phase shifting device 800 may be adjusted to provide phase shift values of $\Delta+s$, $2\Delta+2s$, $3\Delta+3s$, and $4\Delta+4s$, respectively, with respect to the first input terminal 831. The output terminals 842, 843, 844, and 845 of the phase shifting device 800 may be adjusted to provide phase shift values of Δ–s, 2Δ–2s, 3Δ–3s, and 4Δ–4s, respectively, with respect to the second input terminal 841.

Figure 9A:
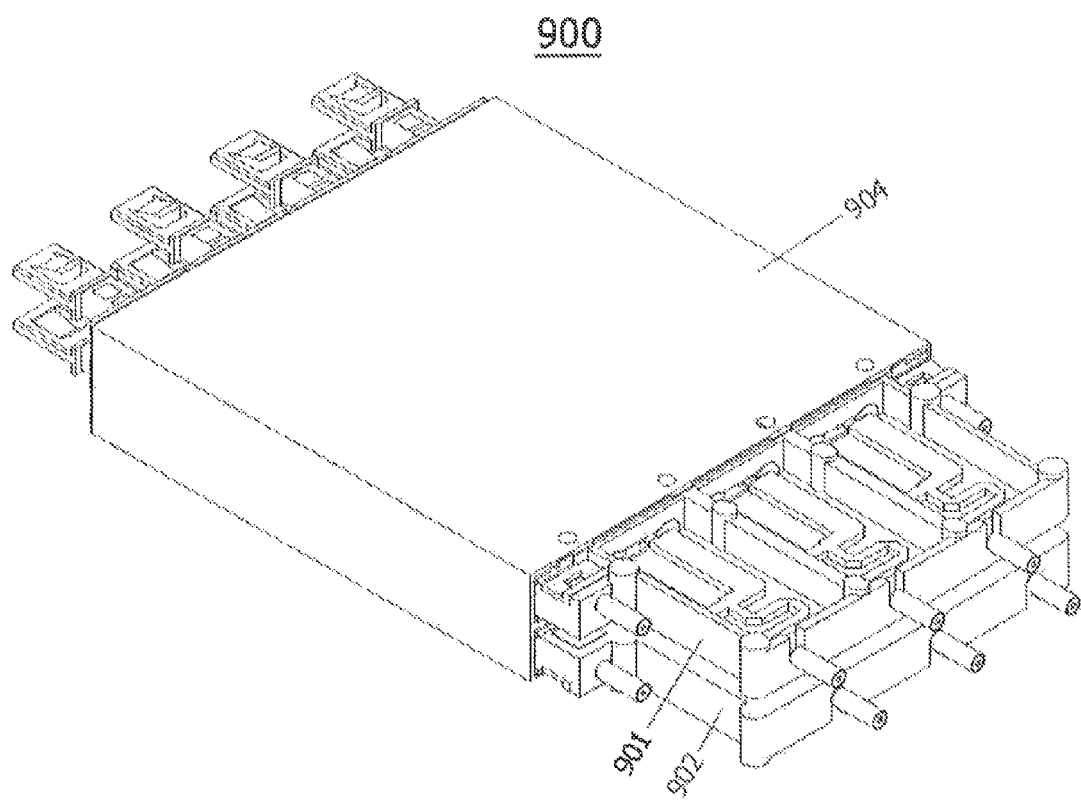
FIGS. 9A and 9B show an external view and an internal view, respectively, of a phase shifting device, according to an exemplary embodiment.
Figure 9B:
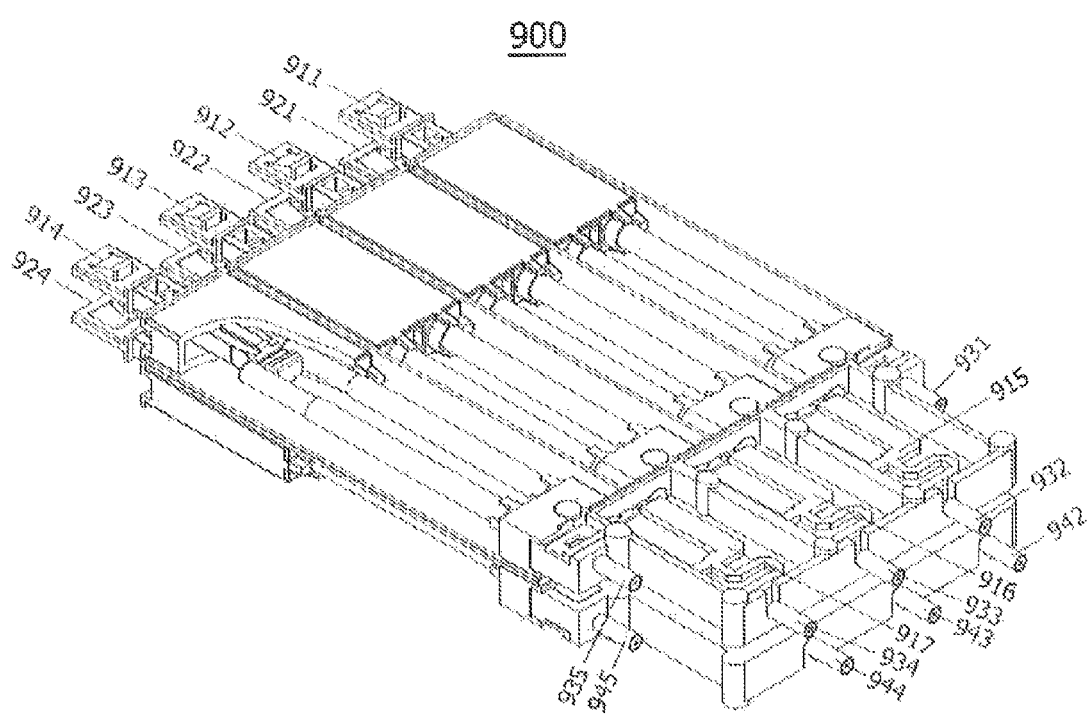

FIGS. 9A and 9B show an external view and an internal view, respectively, of a phase shifting device 900, according to an exemplary embodiment. Referring to FIGS. 9A and 9B, the phase shifting device 900 includes first and second multipath phase shifter assemblies 901 and 902 in a stacked arrangement, and a housing 904 encasing the phase shifter assemblies 901 and 902. The phase shifter assembly 901 includes first, second, third, and fourth phase shifters 911, 912, 913, and 914, respectively, disposed in parallel in a planar arrangement, and first, second, and third power dividers 915, 916, and 917, respectively. The phase shifter assembly 902 includes first, second, third, and fourth phase shifters 921, 922, 923, and 924, respectively, disposed in parallel in a planar arrangement, and first, second, and third power dividers (not shown) under the first, second, and third power dividers 915, 916, and 917, respectively.

In exemplary embodiments, the phase shifting device 900 includes a first input terminal 931, and first, second, third, and fourth output terminals 932, 933, 934, and 935, respectively, provided by the phase shifter assembly 901. The phase shifting device 900 also includes a second input terminal (not shown), and fifth, sixth, seventh, and eighth output terminals 942, 943, 944, and 945, respectively, provided by the phase shifter assembly 902.

In exemplary embodiments, similar to the above description in connection with FIG. 7, the phase shifters 911, 912, 913, and 914 are connected in series through the power dividers 915, 916, and 917 in the phase shifting device 900. In the illustrated embodiment, each of the phase shifters 911, 912, 913, and 914 is configured to apply a phase shift Δ. Therefore the output terminals 932, 933, 934, and 935 of the phase shifting device 900 provide phase shift values of Δ, 2Δ, 3Δ, and 4Δ, respectively, with respect to the first input terminal 931.

In addition, the phase shifters 921, 922, 923, and 924 are connected in series through the power dividers (not shown) respectively under the power dividers 915, 916, and 917 in the phase shifting device 900. In the illustrated embodiment, each of the phase shifters 921, 922, 923, and 924 is configured to apply a phase shift Δ. Therefore the output terminals 942, 943, 944, and 945 of the phase shifting device 900 provide phase shift values of Δ, 2Δ, 3Δ, and 4Δ, respectively, with respect to the second input terminal.

Figure 10:
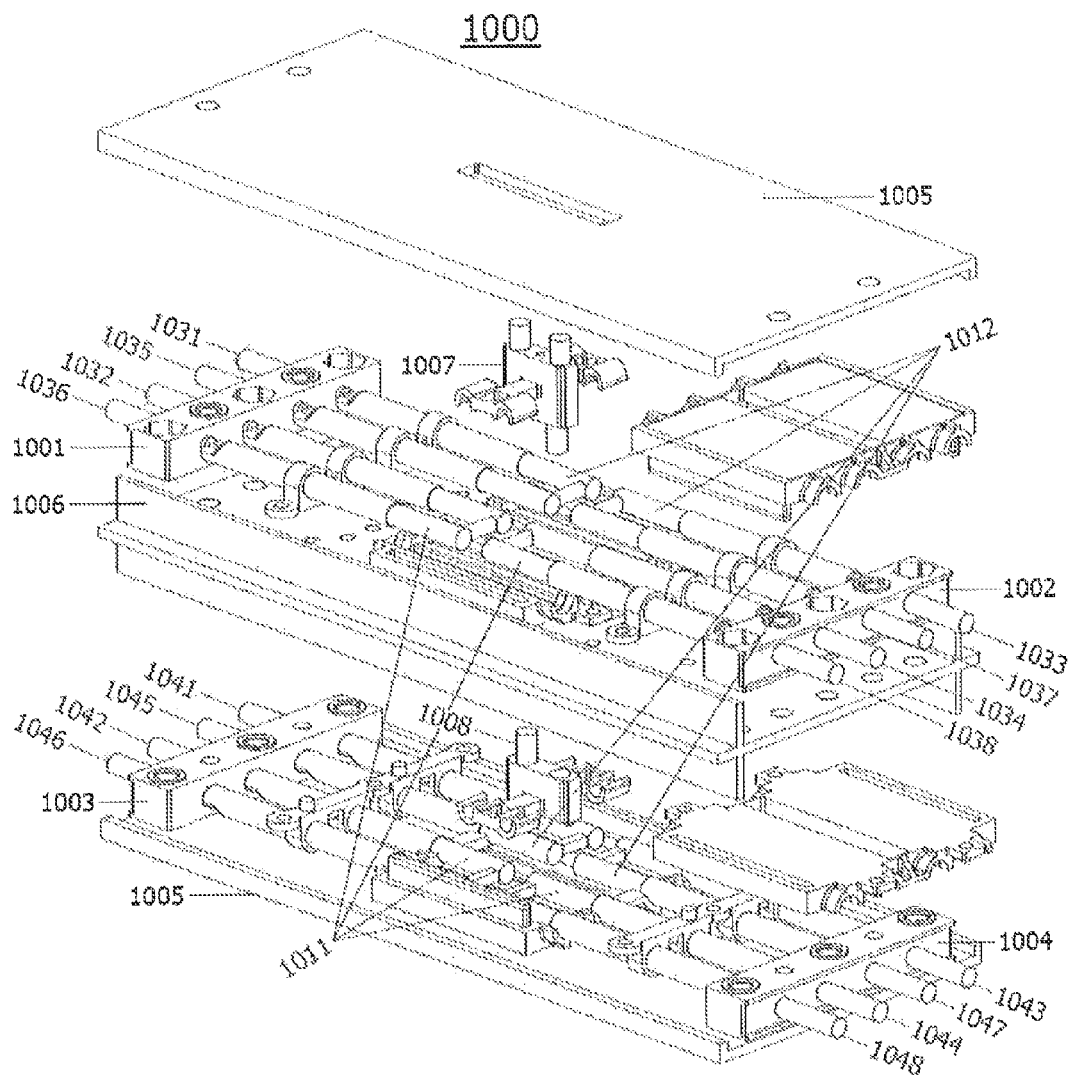
FIG. 10 shows an exploded view of a phase shifting device, according to an exemplary embodiment.

FIG. 10 shows an exploded view of a phase shifting device 1000, according to an exemplary embodiment. Referring to FIG. 10, the phase shifting device 1000 includes first, second, third, and fourth multipath phase shifter assemblies 1001, 1002, 1003, and 1004, a housing 1005 encasing the phase shifter assemblies 1001, 1002, 1003, and 1004, and a separating member 1006 separating the phase shifter assemblies 1001 and 1002 from the phase shifter assemblies 1003 and 1004. For example, the housing 1005 and the separating member 1006 may be manufactured using pultrusion. Pultrusion is a technology for manufacture of materials with constant cross-section.

In exemplary embodiments, the phase shifter assemblies 1001, 1002, 1003, and 1004 are in a stacked arrangement having first and second layers separated by the separating member 1006. In the first layer, the multipath phase shifter assemblies 1001 and 1002 are connected by a connecting member 1007 to form a planar arrangement. In the second layer, the multipath phase shifter assemblies 1003 and 1004 are connected by a connecting member 1008 to form a planar arrangement. Each of the phase shifter assemblies 1001, 1002, 1003, and 1004 includes first and second phase shifters 1011 and 1012, respectively, disposed in parallel.

In exemplary embodiments, the phase shifting device 1000 includes first and second input terminals 1031 and 1032, respectively, and corresponding first and second output terminals 1035 and 1036, respectively, provided by the phase shifter assembly 1001. The phase shifting device 1000 also includes third and fourth input terminals 1033 and 1034, respectively, and corresponding third and fourth output terminals 1037 and 1038, respectively, provided by the phase shifter assembly 1002. The phase shifting device 1000 additionally includes fifth and sixth input terminals 1041 and 1042, respectively, and corresponding fifth and sixth output terminals 1045 and 1046, respectively, provided by the phase shifter assembly 1003. The phase shifting device 1000 further includes seventh and eighth input terminals 1043 and 1044, respectively, and corresponding seventh and eighth output terminals 1047 and 1048, respectively, provided by the phase shifter assembly 1004.

In exemplary embodiments, the phase shifters 1011 and 1012 in each of the phase shifter assemblies 1001, 1002, 1003, and 1004 may operate independently, and are each configured to apply a phase shift Δ. In addition, the connecting member 1007 is configured to adjust the phase shift value generated by each of the output terminals 1035, 1036, 1037, and 1038 of the phase shifting device 1000, by adjusting signal transmission path lengths in the phase shifters 1011 and 1012 in each of the phase shifter assemblies 1001 and 1002. For example, the output terminals 1035 and 1036 of the phase shifting device 1000 may each be adjusted to provide a phase shift value of Δ+s, with respect to the respective input terminals 1031 and 1032, and the output terminals 1037 and 1038 of the phase shifting device 1000 may each be adjusted to provide a phase shift value of Δ–s, with respect to the respective input terminals 1033 and 1034. Similarly, the connecting member 1008 is configured to adjust the phase shift value generated by each of the output terminals 1045, 1046, 1047, and 1048 of the phase shifting device 1000, by adjusting signal transmission path lengths in the phase shifters 1011 and 1012 in each of the phase shifter assemblies 1003 and 1004. For example, the output terminals 1045 and 1046 of the phase shifting device 1000 may each be adjusted to provide a phase shift value of Δ+s, with respect to the respective input terminals 1041 and 1042, and the output terminals 1047 and 1048 of the phase shifting device 1000 may each be adjusted to provide a phase shift value of Δ–s, with respect to the respective input terminals 1043 and 1044.

In exemplary embodiments, the phase shifting device 1000 may be further configured to provide additional phase shift values by connecting one or more output terminals with one or more input terminals, respectively, of the phase shifting device 1000. For example, the output terminal 1035 and the input terminal 1032 may be connected with a cable, and the output terminal 1045 and the input terminal 1042 may be connected with a cable. Also for example, the output terminal 1037 and the input terminal 1034 may be connected with a cable, and the output terminal 1047 and the input terminal 1044 may be connected with a cable.

Figure 11:
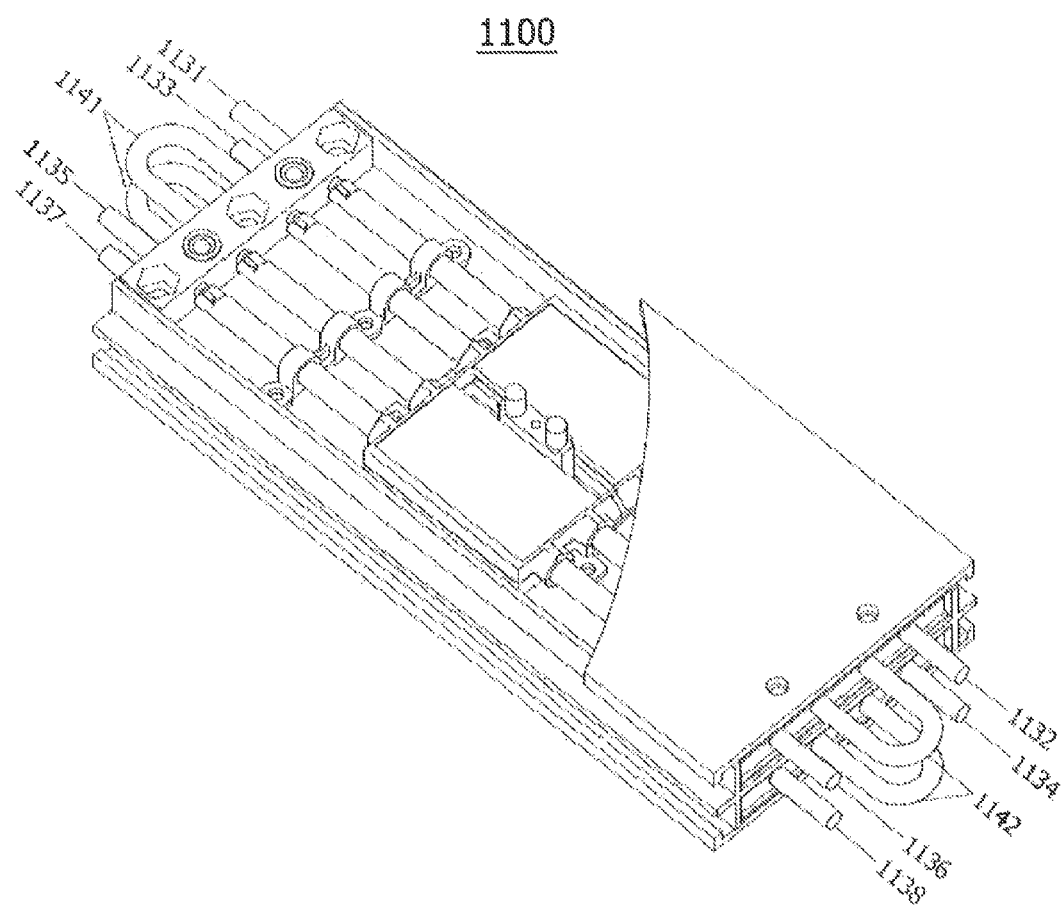
FIG. 11 shows a perspective view of a phase shifting device, according to an exemplary embodiment.

FIG. 11 shows a perspective view of a phase shifting device 1100 resulting from the above described configuration of the phase shifting device 1000 (FIG. 10), according to an exemplary embodiment. Referring to FIG. 11, the phase shifting device 1100 includes first, second, third, and fourth input terminals 1131, 1132, 1133, and 1134, respectively, and corresponding first, second, third, and fourth output terminals 1135, 1136, 1137, and 1038, respectively.

By connecting selected input and output terminals with cables 1141 and cables 1142, the output terminals 1135, 1136, 1137, and 1038 may each provide a phase shift value of 2Δ with respect to their respective corresponding input terminals 1131, 1132, 1133, and 1134.

In exemplary embodiments, each of the above-described power dividers may be implemented using an air stripline, a coaxial cable, an air microstrip, a dielectric microstrip, dielectric stripline, etc. Each of the above-described power dividers may also be a multi-stage divider for an optimized impedance bandwidth and a variable power-dividing ratio.

Other embodiments of the invention will be apparent to those skilled in the art from consideration of the specification and practice of the embodiments disclosed herein. The scope of the invention is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A phase shifting device, comprising:
   a housing; and
   at least one multipath phase shifter assembly in the housing, wherein the multipath phase shifter assembly includes at least two phase shifters each in a strip shape, and disposed in parallel along a same length direction of the at least two phase shifters in a planar arrangement;
   wherein any two adjacent ones of the phase shifters in the phase shifting device are connected through a power divider.

2. The phase shifting device according to claim 1, wherein the power divider includes an input terminal, and first and second output terminals, the input terminal of the power divider being connected to an output terminal of a first one of the phase shifters, the first output terminal of the power divider being connected to an input terminal of a second one of the phase shifters, and the second output terminal of the power divider being an output terminal of the phase shifting device.

3. The phase shifting device according to claim 1, wherein the power divider is implemented using one of an air microstrip, an air stripline, a dielectric microstrip, or a dielectric stripline.

4. The phase shifting device according to claim 1, wherein the power divider is implemented using a coaxial cable with a length equal to a quarter of a wavelength corresponding to a central operating frequency.

5. The phase shifting device according to claim 1, comprising first and second multipath phase shifter assemblies in a stacked arrangement.

6. The phase shifting device according to claim 5, wherein each of the first and second multipath phase shifter assemblies includes at least two phase shifters disposed in parallel in a planar arrangement.

7. The phase shifting device according to claim 5, further comprises a separating member to separate the first and second multipath phase shifter assemblies in the stacked arrangement.

8. The phase shifting device according to claim 1, wherein the housing is manufactured using a pultrusion technology.

9. The phase shifting device according to claim 1, wherein the at least two phase shifters are connected in series through a cable.

10. A phase shifting device, comprising:
    a housing; and
    first and second multipath phase shifter assemblies in the housing in a stacked arrangement, wherein each of the first and second multipath phase shifter assemblies includes at least two phase shifters each in a strip shape, and disposed in parallel along a same length direction of the at least two phase shifters in a planar arrangement;
    wherein any two adjacent ones of the phase shifters in the phase shifting device are connected through a power divider.

11. The phase shifting device according to claim 10, further comprises a separating member to separate the first and second multipath phase shifter assemblies in the stacked arrangement.

12. The phase shifting device according to claim 10, wherein the housing is manufactured using a pultrusion technology.

* * * * *